United States Patent
Soltesz et al.

(10) Patent No.: US 11,658,644 B2
(45) Date of Patent: May 23, 2023

(54) PROGRAMMABLE DUTY CYCLE DISTORTION GENERATOR

(71) Applicant: MACOM Technology Solutions Holdings, Inc., Lowell, CA (US)

(72) Inventors: Dario Soltesz, Lowell, MA (US); Quazi Ikram, Lowell, MA (US); Saman Jafarlou, Lowell, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 17/543,557

(22) Filed: Dec. 6, 2021

(65) Prior Publication Data

US 2022/0182042 A1 Jun. 9, 2022

Related U.S. Application Data

(60) Provisional application No. 63/122,330, filed on Dec. 7, 2020.

(51) Int. Cl.
*H03K 3/017* (2006.01)

(52) U.S. Cl.
CPC .................. *H03K 3/017* (2013.01)

(58) Field of Classification Search
CPC ...................................... H03K 3/017
See application file for complete search history.

(56) References Cited

U.S. PATENT DOCUMENTS

| 10,270,429 | B1* | 4/2019 | Wang | H04L 25/063 |
| 2009/0160516 | A1* | 6/2009 | Guo | H03K 5/1565 327/175 |
| 2012/0019299 | A1* | 1/2012 | McLeod | H03K 5/1565 327/175 |
| 2019/0229712 | A1* | 7/2019 | Suzuki | H03K 5/1565 |

\* cited by examiner

*Primary Examiner* — Sibin Chen
(74) *Attorney, Agent, or Firm* — Weide & Miller, Ltd.

(57) ABSTRACT

A method and system for controlling duty cycle distortion in a signal. The system includes an input configured to receive a square wave input signal and a filter configured to transform the square wave input signal into a signal with sloped transitions. One or more linear buffers introduce duty cycle distortion into the signal based on a duty cycle distortion signal to create a duty cycle distorted signal. One or more output buffers receive and transform the duty cycle distorted signal into a distorted square wave signal. A feedback loop receives the distorted square wave signal and compares it to a duty cycle distortion control signal to generate an error signal, which indicates the difference between the square wave signal and the desired output duty cycle. The error signal is converted to the duty cycle distortion signal and presented to the one or more linear buffers.

19 Claims, 5 Drawing Sheets

PROGRAMMABLE DUTY CYCLE DISTORTION GENERATOR

1. FIELD OF THE INVENTION

The invention relates to duty cycle distortion and in particular, to a method and apparatus for correcting or introducing a controlled amount of duty cycle distortion into a signal.

2. RELATED ART

Duty cycle distortion in signals can degrade signal quality and increase the bit error rate (BER). Duty cycle is defined as the amount of time in which the signal, such as a clock signal, is high in relation to the clock period. FIG. 1 illustrates exemplary signal plots with different duty cycles. As shown in FIG. 1, 50% duty cycle plot 104 represents a signal with an even split between when the square wave signal is at a high level and at a low level. A 75% duty cycle plot 108 represents a signal with the square wave signal is at a high level for 75% of a cycle and at a low level for the remaining 25% of the cycle. A 25% duty cycle plot 108 represents a signal with the square wave signal is at a high level for 25% of a cycle and at a low level for the remaining 75% of the cycle. Other duty cycles are possible.

Due to the unwanted nature of duty cycle, system designers may want to correct duty cycle distortion so that it does not interfere with downstream processing. In other situations, duty cycle distortion may be introduced to a signal to perform tests on downstream processing elements. Testing, for example shortly after manufacturing, involves artificially downgrading (using duty cycle distortion) the quality of the signal to test how well the downstream processing elements cope with the poor-quality data, and whether it can still recover and process the signal that was transmitted. A downstream element's ability to recover a signal with duty cycle distortion is referred to as its jitter tolerance. Therefore, there is a need in the art for a method and apparatus to correct duty cycle distortion and to intentionally introduce duty cycle distortion to test downstream components.

Proposed solutions to address these issues suffer from several drawbacks. For example, as signal speeds increase, the prior methods of correcting for duty cycle distortion are not suitable. One prior art solution is to test downstream components which involves use of high-speed test equipment. However, this test equipment is expensive, complex to operate, and time consuming to use. Another proposed solution for resiliency to jitter type distortion involves use of a circuit that performs redriving of the signal. However, this adds additional complexity, power consumption, and cost to the circuits. Hence, it is desirable to provide a new and improved technique for improving circuit operation and testing integrated circuits.

SUMMARY

To overcome the drawbacks of the prior art and provide additional benefits, a system for controlling duty cycle distortion in a signal is disclosed. In one embodiment, the system comprises an input configured to receive a square wave input signal and a filter configured to transform the square wave input signal into a signal with sloped transitions. One or more linear buffers are provided and configured to introduce duty cycle distortion into the signal with sloped transitions, based on a duty cycle distortion signal, to create a duty cycle distorted signal. One or more output buffers are configured to receive and transform the duty cycle distorted signal into a distorted square wave signal. A feedback loop receives the distorted square wave signal and compares it to a duty cycle distortion control signal to generate an error signal indicating the difference between the square wave signal and the desired output duty cycle. The feedback loop also converts the error signal to the duty cycle distortion signal and presents the duty cycle distortion signal to the one or more linear buffers to introduce duty cycle distortion.

In one embodiment, the signal with a sloped transition is a triangle wave signal. The input signal may be a distorted square wave signal. In one configuration, the duty cycle distortion control signal is a digital signal, and it is presented to a digital to analog converter which converts the duty cycle distortion control signal to an analog signal. It is contemplated that the feedback path may include an RC filter. The system described above may further comprise one or more input buffers configured to establish the signal as a square wave signal.

Also disclosed is a system for introducing duty cycle distortion in a signal. In one embodiment, the system comprises an input configured to receive a clock signal and one or more linear buffers configured to introduce duty cycle distortion into the clock signal based on a duty cycle distortion signal to create a duty cycle distorted signal. One or more output buffers are configured to receive and transform the duty cycle distorted signal into a square wave signal with duty cycle distortion. A feedback loop is configured to receive the square wave signal with duty cycle distortion and compare it to a duty cycle distortion control signal to generate an error signal representing the difference between the square wave signal with duty cycle distortion and the duty cycle distortion control signal. Based on this comparison, the error signal is converted to the duty cycle distortion signal and the duty cycle distortion signal is presented to the one or more linear buffers such that the linear buffers introduce the duty cycle distortion into the clock signal to create the square wave signal with duty cycle distortion. The amount of duty cycle distortion is controlled by the duty cycle distortion control signal.

In one configuration, a filter processes the clock signal to create a triangle wave signal, which is presented to the one or more linear buffers. The clock signal may be a square wave signal. In one embodiment, the duty cycle distortion control signal is presented to a digital to analog converter which converts the duty cycle distortion control signal to an analog control signal. It is contemplated that the feedback path may include an RC filter. This system may further comprise one or more input buffers configured to establish the clock signal as a square wave signal.

Also disclosed is a method for introducing or controlling duty cycle distortion (DCD) in a signal. In one embodiment, this method includes receiving the signal and a DCD target value and then processing the signal with one or more buffers and one or more filters to create a buffered and filtered signal. This method also provides the buffered and filtered signal to one or more series connected linear buffers, such that the one or more series connected linear buffers generate an output signal. This method of operation provides the output signal and the DCD target value to an error amplifier that is part of a feedback loop and processes the output signal and the DCD target value with the error amplifier to generate a difference signal. The difference signal is then provided to at least one of the one or more linear buffers, such that the one or more linear buffers that receive the difference signal introduce duty cycle distortion into the buffered and filtered signal. The amount of duty cycle distortion is controlled by the DCD target value.

On one configuration, the received signal is a differential signal. This method may further comprise filtering the output signal before providing the output signal to the error amplifier. In one embodiment, the DCD target value is a digital value, and the method further comprises converting the DCD target value to an analog format prior to presenting the DCD target value to the error amplifier. The one or more buffers that receive the difference signal may be one or more linear buffers. This method may further comprise converting the difference signal, or a filtered version of the difference signal, from a voltage to a current by a Gm cell before being provided to the one or more linear buffers. In one configuration, the amount of duty cycle distortion introduced into the buffered and filtered signal is controlled by the DCD target value.

Other systems, methods, features and advantages of the invention will be or will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

In the figures, like reference numerals designate corresponding parts throughout the different views.

DETAILED DESCRIPTION

In general, the invention is a programmable duty cycle distortion generator configured to either compensate for duty cycle distortion (DCD) during operation or intentionally introduce DCD into the clock signal path to test downstream components' ability to overcome and maintain operation when presented with a clock signal that has DCD. Although described in relation to a clock signal, it is contemplated that the system and method disclosed herein may operate on any type of signal.

Through an input to a DAC, a user or other system can introduce current offset in specific nodes of the signal path. This action introduces DCD to the clock signal that passes through the clock signal path. A feedback loop, with an error signal generator, determines and controls the amount of DCD in the clock signal to control accuracy of the amount of DCD that is injected into the clock signal. This may occur during operation to compensate for DCD or be used to intentionally stress the resilience of the signal path and downstream elements which receive the clock signal. Although described as a clock signal, it is contemplated that any signal may be substituted for the clock signal.

Figure 1:
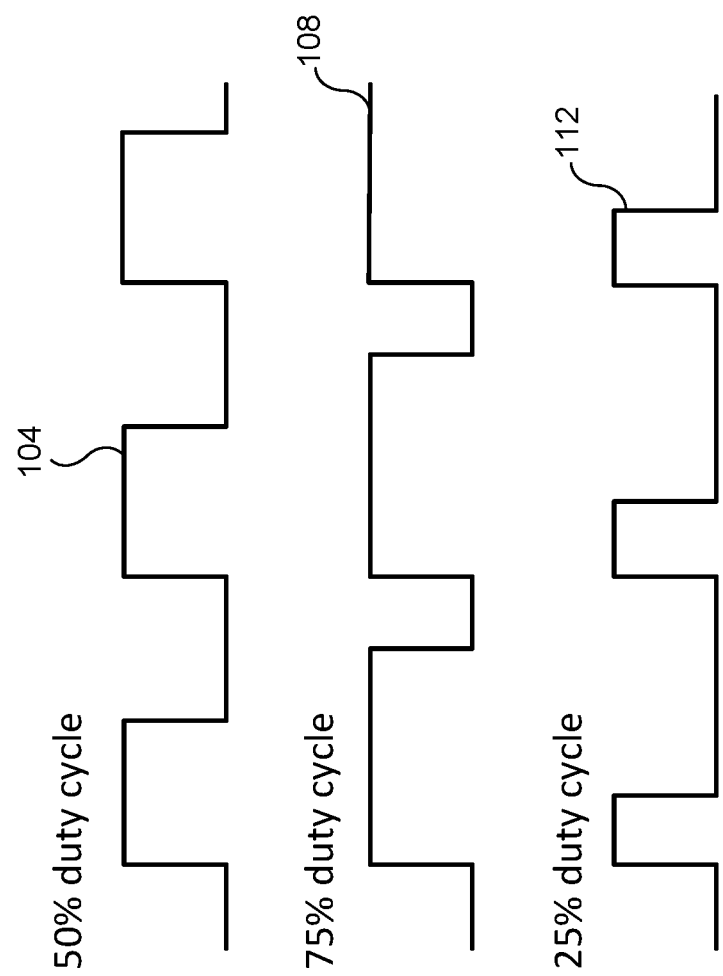
FIG. 1 illustrates exemplary signal plots with different duty cycle values.
Figure 2:
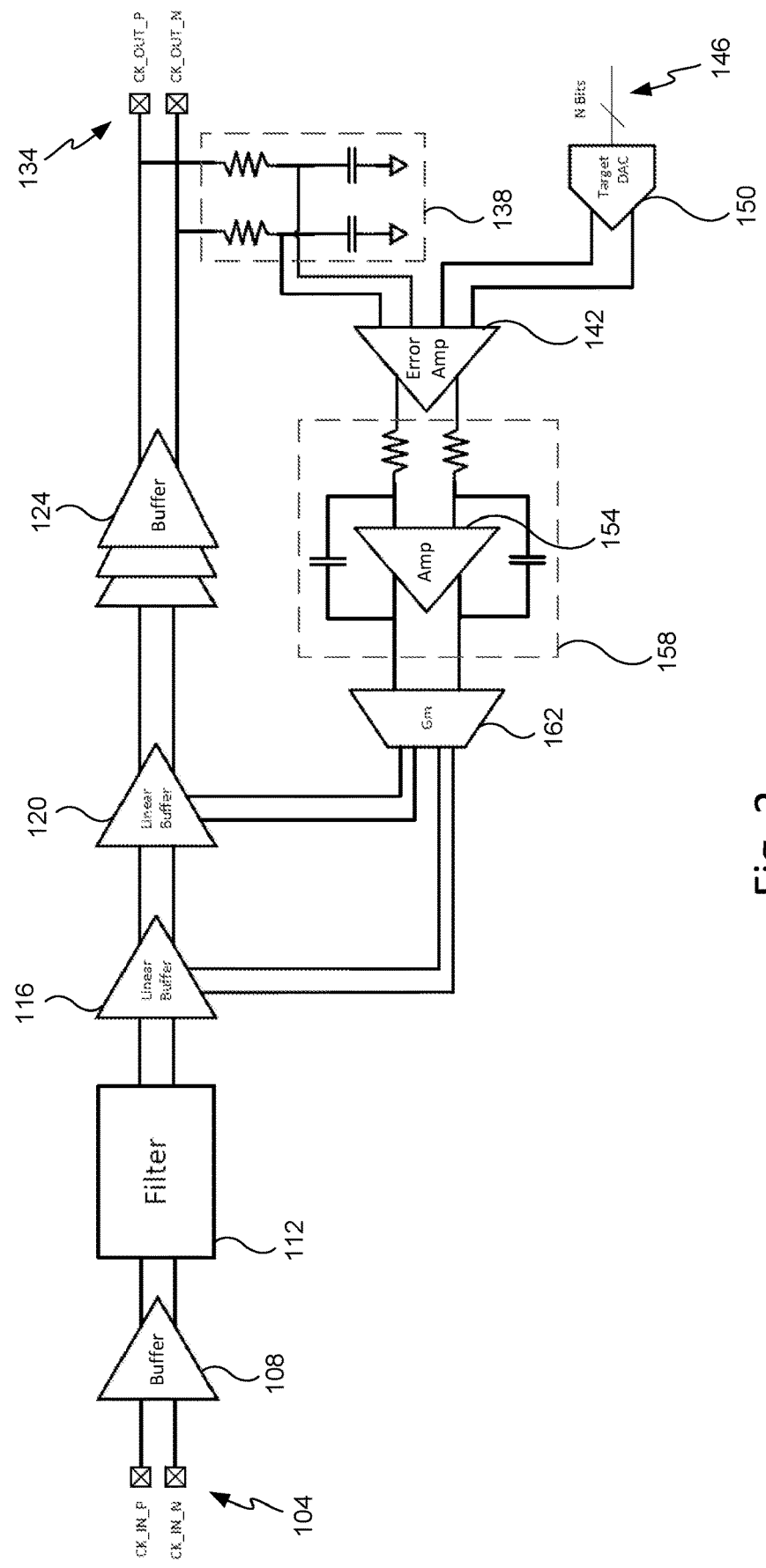
FIG. 2 is a block diagram illustrating an example embodiment of the duty cycle distortion generator.

FIG. 2 is an example embodiment of the programmable duty cycle distortion generator. As shown, the clock signal input 104 receives a clock signal which is provided to a buffer 108. The buffer 108 processes the input signal to form a clean square wave signal. For example, the input signal may be distorted or have a shape that is less than preferred, and the buffer 'squares up' the signal to create a controlled and well-defined signal with square edges (transitions). In one embodiment the buffer 108 is a CML (common mode logic) differential pair configuration.

The output of the buffer connects to a filter 112. In this embodiment, the filter 112 is a programable filter configured to convert the square wave input to a triangular wave, sinusoidal signal, or any other type signal with a transition slope that is more gradual than the square wave. The programmable filter 112 may be programmed or configured to have a transfer function, or pass band based on the frequency of the input signal presented to the filter. In one embodiment, the filter 112 is a low pass filter. Thus, the frequency cut off of the filter 112 changes or can be changed. The filter 112 may be configured as any type programmable filter, such as a digital filter, RC filter, or any other configuration. In one embodiment, input to the buffer 108 may be a square wave, while the output of the filter 112 is a triangular wave. The filtering by filter 112 occurs prior to the adjustment of DCD. The present system would not function properly if the filtering occurred after the introduction of DCD by the buffers 116, 120 (clock adjustment).

The output of the filter 112 feeds into a first linear buffer 116 which in turn connects to a second linear buffer 120. The linear buffers 116, 120 may be CML differential pair with heavy degeneration but in other embodiment other buffer configuration may be adapted for use. The configuration of the buffers 116, 120 makes them linear in operation. The main function of the linear buffers 116, 120 is to process the filtered signal and the signal from the feedback loop (specifically from the GM cell 162) to shift the common mode of the P path signal and N path signal and thus introduce DCD into the signal. In particular, it will increase the magnitude (push up) the P signal and decrease (push down) the N signal or vice-versa to adjust the DCD. The output of the linear buffers 116, 120 is a triangular wave, sinusoidal wave, or other similar signal. As discussed below, the linear buffers 116, 120 receive a DCD signal causing the linear buffers to introduce DCD into the clock signal. Two linear buffers 116 are used to achieve a wide dynamic range in the DCD adjustment. If only one linear buffer is used, it may quickly saturate, and it, may not be possible to introduce a +/−25% DCD into the signal. As a result, the DCD introduction is distributed across two different linear buffers 116, 120. In other embodiments a single linear buffer may be used if less DCD is to be introduced, or more than two linear buffers may be used if more than 25% DCD variance is required.

The output of the linear buffers 116, 120 feed into one or more buffers 124. The one or more buffers 124 may be the same as the buffer 108. Multiple buffers are utilized to form a clean square wave signal at the frequency of operation. A "clean" square wave signal is defined as a signal with defined edges which have generally vertical rising and falling edges. A square wave signal is known in the art and as such is not described in detail herein. In some embodiments, single buffer would not transform its input signal to a clean square wave signal. Each buffer 124 may be the same type buffer as buffer 108. The output of the one or more buffers 124 is presented at the output 134 as a square wave.

To introduce distortion to the duty cycle of the clock signal, each of the differential mode signals are provided to a RC filter 138 as shown. The RC filter may comprise any combination of resistive elements and capacitive elements, such as but not limited to, resistors and capacitors. The RC filter 138 provides its outputs to an error amplifier 142 as a differential signal. The error amplifier 142 also receives a differential signal from a target DAC 150. The output of the target DAC 150 represents a distortion control signal provided on a DAC input 146. The distortion control signal determines the amount of DCD that is injected into the clock signal. Thus, with this system, the user can correct and compensate for unwanted duty cycle distortion, or intentionally introduce a precise intended amount of DCD based on the DAC input. Some prior art systems control and set the duty cycle to a particular value that is optimal for that specific circuit or the environment of use, but it is not user adjustable and cannot be set based on a target value, and these prior art systems suffer from drawback which are not associated with the innovation described herein.

The error amplifier 142 outputs, as an error signal, the difference between 1) the differential clock signal from the RC network 138 and 2) the differential signal that is output from the DAC 150. In this example embodiment, the P signal from the RC network 138 is compared to target P signal and the N signal from the RC network 138 is compared to target N signal.

The error signal from the error amplifier 142 is provided to an active filter 158 that includes an amplifier 154. The active filter 158 is configured to maintain stability in the loop. The output of the active filter 158 is provided to a Gm cell 162 which is configured to convert the voltage output from the active filter 158 to a corresponding current which is provided to both linear buffers 116, 120. In this embodiment, the same signal (from the Gm cell 162) is provided to both linear buffers 116, 120. In other embodiments the Gm cell may not be needed.

During operation, the distortion control signal provided to DAC 150 determines how much distortion to introduce into the clock signal. The actual clock signal is monitored and compared to the distortion control signal to generate an error signal which is used to increase or decrease the amount of DCD introduced into the clock signal to force the DCD to match the distortion control signal provided to the target DAC 150.

Figure 3:
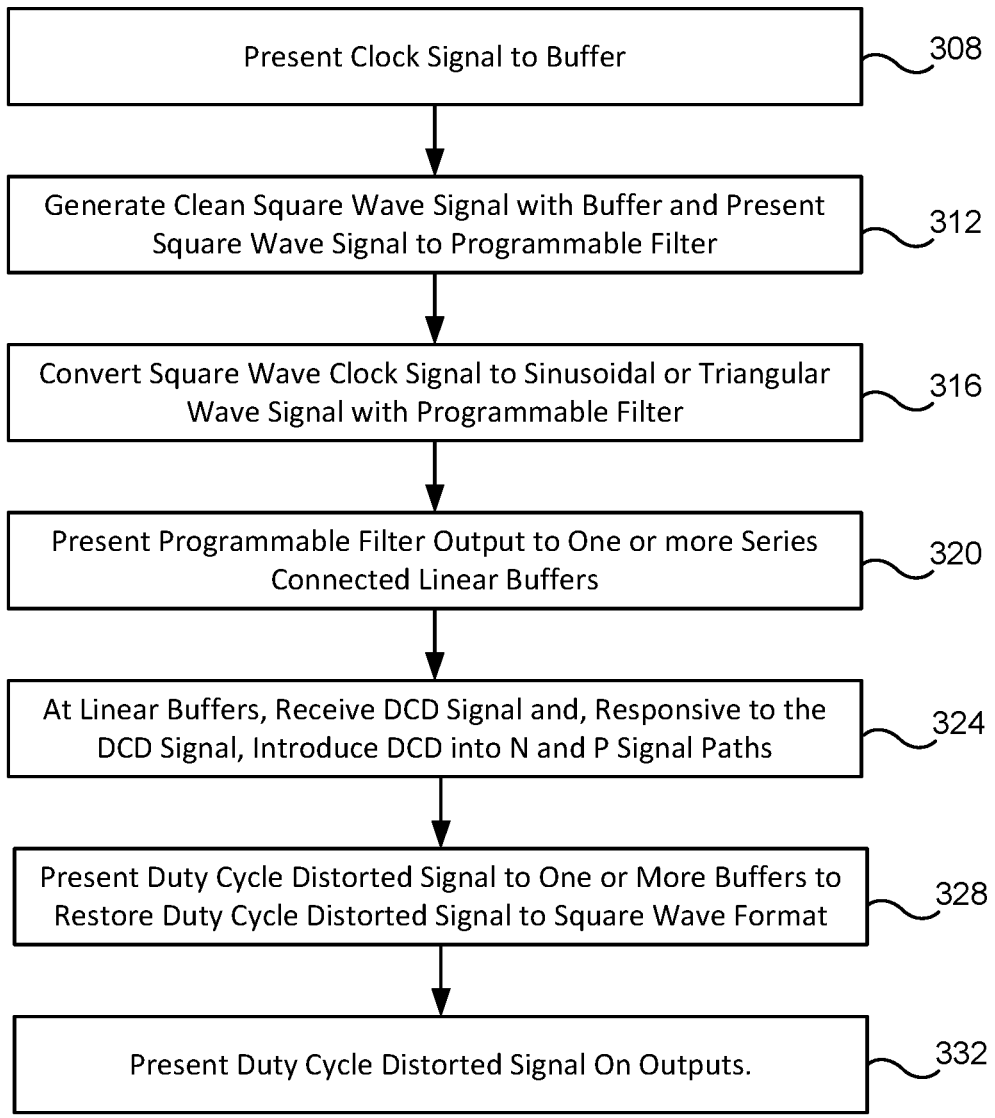
FIG. 3 is an operational flow diagram of an example method of operation of the duty cycle distortion generator.

FIG. 3 is an operational flow diagram of an example method of operation of the duty cycle distortion generator. This is but one possible method of operation and as such it is contemplated that other methods of operation may be enabled. As shown in FIG. 3, at a step 308, a clock signal is presented to a buffer. The clock signal maybe single ended or a differential pair signal. Then, at a step 312, the buffer or buffers process the clock signal to generate a clean square wave signal and present the square wave signal to a programmable filter. The term clean, as referenced above, means a signal that appears as a square wave signal such as for example when the rise and fall times (Tr and Tf) are much smaller (<10% for instance) than the square-wave period.

At a step 316, a programmable filter converts the square wave signal to a sinusoidal or triangular wave signal. Then, at a step 320, the output of the programmable filter output connects to one or more series connected linear buffers. The linear buffer, based on a DCD correction signal or DCD introduction signal, are configured to introduce, or modify the duty cycle of the clock signal. In one embodiment, the linear buffer(s) correct for existing duty cycle in the clock signal while in another embodiment the linear buffer(s) introduced duty cycle distortion into the clock signal.

At a step 324, the linear buffer also receives the DCD signal and, responsive to the DCD signal, introduced DCD into the clock signal, such as in the case of a differential signal, into the P signal and the N signal. As mentioned above, this may be done to correct or compensate for DCD in the clock signal or to intentionally introduce DCD into the clock signal to test other components of the system when presented with varying levels of DCD. After processing by the one or more linear buffers, the clock signal (buffer output) has duty cycle distortion introduced or has been duty cycle distortion compensated. At a step 328 the buffer output, referred to herein as the duty cycle distorted signal is provided to the one or more buffers that are after the linear buffers to restore the duty cycle distorted (adjusted) signal to a square wave, as is typical of a clock signal. It is contemplated that devices other than buffers may be used to perform this operation.

At a step 332 the duty cycle distorted (adjusted) signal is presented on the outputs of the system. The clock outputs may be presented to any system or element in an electronic system that utilizes a clock signal.

Figure 4:
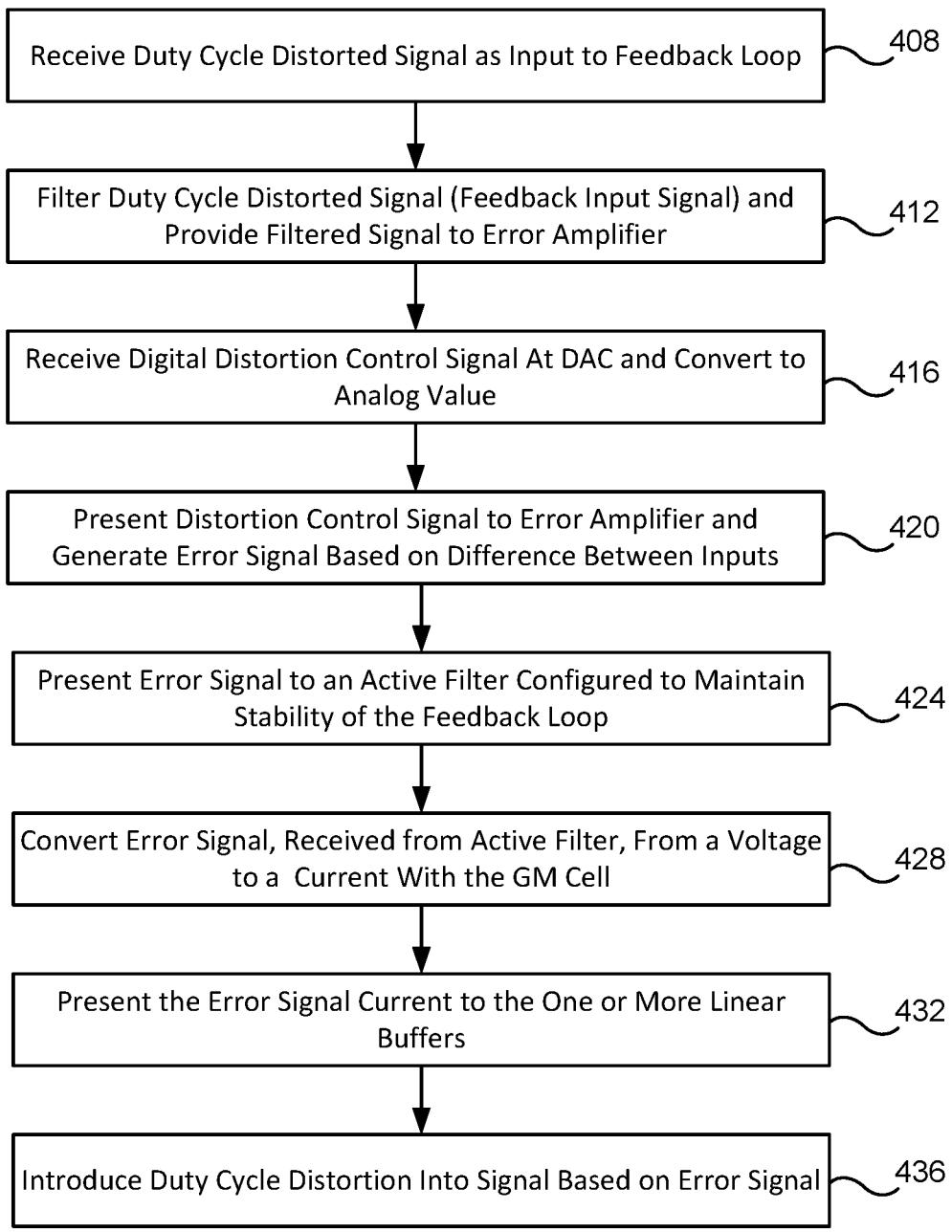
FIG. 4 is an operational flow diagram of an example method of duty cycle distortion signal generation and feedback.

FIG. 4 is an operational flow diagram of an example method of duty cycle distortion signal generation and feedback. This method of operation focuses on the operation of the feedback loop, while FIG. 3 focuses on the operation of the clock signal path. It is contemplated that other methods of operation exist in addition to that shown in FIG. 4. At a step 408, the feedback loop receives the duty cycle distorted (adjusted) clock signal from the output path. This is one input to the feedback loop. At a step 412, the duty cycle distorted (adjusted) clock signal is filtered, such as by an RC network circuit, and the filtered signal is provided to an error amplifier, which is configured as a comparator.

Also occurring, at a step 416, as part of the feedback loop operation is the duty cycle distortion (adjustment) control signal is received at the DAC and is converted to an analog signal. In some embodiments, the control signal is already in an analog format and as such the conversion by the DAC is not required. Then, at a step 420, the distortion control signal is also presented to the error amplifier. The error amplifier generates an error signal representing the difference between its two inputs, namely the difference between the clock signal input to the feedback loop and the control signal to the DAC. The output of the error amplifier is presented to an active filter at a step 424. The active filter is configured to maintain stability of the feedback loop. In other embodiments, filters or loop stability elements other than an active filter may be utilized.

At a step 428, the error signal from the error amplifier, as output from the filter is provided to a voltage to current converter with a GM cell. It is contemplated that in some embodiments, the output of the filter may be provided directly to the linear buffers. Thereafter, at a step 432, the error signal current is provided to the one or more linear buffers. Then, at a step 436, the duty cycle distortion (based on the error signal) is introduced into the clock signal to thereby adjust the distortion in the clock signal.

Figure 5:
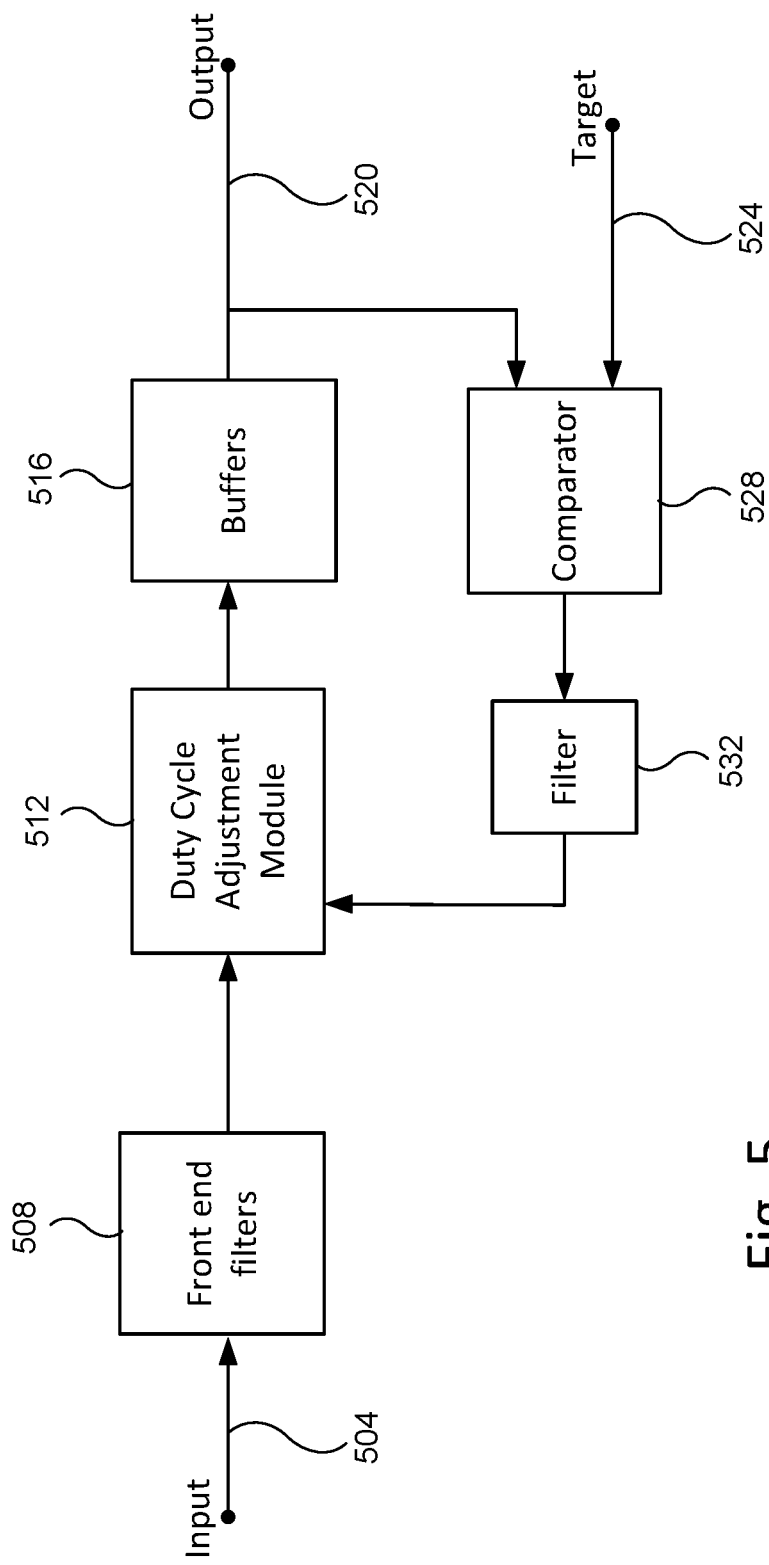
FIG. 5 illustrates a block diagram of a generalized duty cycle control system.

FIG. 5 illustrates a block diagram of a generalized duty cycle control system. This is but one possible duty cycle control system and other embodiments are contemplated which do not depart from the claims. In this embodiment, an input connects to one or more front-end filters 508. The front-end filters 508 filter the signal or manipulate the signal into a different format. Elements other than a filter may be used. In one configuration the filters 508 comprise a programmable filter configured to convert a square wave input signal to a triangular wave, sinusoidal signal, or any other type signal with a transition slope that is more gradual than the square wave.

The output of the front-end filters 508 feeds into a duty cycle adjustment module 512 that is configured to modify the duty cycle of the received signal based on a control signal from a filter 532. Modification of the duty cycle may occur by shifting the common mode voltages of the two components of the differential signal, shifting the threshold voltage that makes a buffer decide if producing a logic high or low at its output, making the rise time different than the fall time or any other method currently known or develop in the future.

The duty cycle adjustment module 512 may comprise any type hardware, software, or combination there configured to adjust the duty cycle of a signal. In one embodiment, the duty cycle adjustment module 512 comprises one or more buffers. The output of the duty cycle adjustment module 512 outputs a duty cycle adjusted signal to one or more buffers 516.

The buffers 516 are configured to restore the duty cycle adjusted signal to a different format, such as back to a square wave signal or the same format signal was provided to the front-end filters 508. If the signal provided on the input 504 is already in a format suitable for duty cycle adjustment by the duty cycle adjustment module, then the front-end filters 508 may not be needed. The output from the buffers 516 is presented on an output 520 as a duty cycle adjusted signal.

The output signal is also provided a comparator 528. The comparator 528 also receives a target value on target input 524. The target value may be in analog or digital format with ADC or DAC (not shown) as needed for processing. The comparator 528 compares the output signal to the target value to generate a difference or error signal that is provided to an optional filter 532. In this embodiment the RC network and DAC are not shown and may be considered options. The target value represents an amount of change in the duty cycle to be introduced by the duty cycle adjust module 512. It is contemplated that the duty cycle may be increased or decreased based on the target value. The optional filter 532 may be provided to maintain stability and reduce the speed at which the loop updates or changes the duty cycle. Additional elements may be included in the system of FIG. 5 which are not shown as would be understood by one or ordinary skill in the art.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A system for controlling duty cycle distortion in a signal comprising:
   an input configured to receive a square wave input signal;
   a filter configured to transform the square wave input signal into a signal with sloped transitions;
   one or more linear buffers configured to introduce duty cycle distortion into the signal with sloped transitions based on a duty cycle distortion signal to create a duty cycle distorted signal;
   one or more output buffers configured to receive and transform the duty cycle distorted signal into a distorted square wave signal;
   a feedback loop configured to:
      receive the distorted square wave signal and compare it to a duty cycle distortion control signal to generate an error signal indicating the difference between the square wave signal and the desired output duty cycle; and
      converting the error signal to the duty cycle distortion signal and presenting the duty cycle distortion signal to the one or more linear buffers to introduce duty cycle distortion.

2. The system of claim 1 wherein the signal with a sloped transition is a triangle wave signal.

3. The system of claim 1 wherein the input signal is a distorted square wave signal.

4. The system of claim 1 wherein the duty cycle distortion control signal is presented to a digital to analog converter which converts the duty cycle distortion control signal to an analog signal.

5. The system of claim 1 wherein the feedback path includes an RC filter.

6. The system of claim 1, further comprising one or more input buffers configured to establish the signal as a square wave signal.

7. The system of claim 1 wherein the clock signal is a square wave signal.

8. The system of claim 1 wherein the duty cycle distortion control signal is presented to a digital to analog converter which converts the duty cycle distortion control signal to an analog control signal.

9. The system of claim 1 wherein the feedback path includes an RC filter.

10. The system of claim 1, further comprising one or more input buffers configured to establish the clock signal as a square wave signal.

11. A system for introducing duty cycle distortion in a signal comprising:
    an input configured to receive a clock signal;
    a filter configured to processes the clock signal to represent that clock signal as a triangle wave signal, which is presented to one or more linear buffers;
    one or more linear buffers configured to introduce duty cycle distortion into the clock signal based on a duty cycle distortion signal to create a duty cycle distorted signal;
    one or more output buffers configured to receive and transform the duty cycle distorted signal into a square wave signal with duty cycle distortion;
    a feedback loop configured to receive the square wave signal with duty cycle distortion and compare it to a duty cycle distortion control signal to generate an error signal representing the difference between the square wave signal with duty cycle distortion and the duty cycle distortion control signal; and
    converting the error signal to the duty cycle distortion signal and presenting the duty cycle distortion signal to the one or more linear buffers such that the linear buffers introduce the duty cycle distortion into the clock signal to create the square wave signal with duty cycle distortion and the amount of duty cycle distortion is controlled by the duty cycle distortion control signal.

12. A method for introducing or controlling duty cycle distortion (DCD) in a signal comprising:
    receiving the signal and a DCD target value;
    processing the signal with one or more buffers and one or more filters to create a buffered and filtered signal;
    providing the buffered and filtered signal to one or more series connected linear buffers, the one or more series connected linear buffers generating an output signal;
    providing the output signal and the DCD target value to an error amplifier that is part of a feedback loop;

processing the output signal and the DCD target value with the error amplifier to generate a difference signal; and providing the difference signal to at least one of the one or more linear buffers, such that the one or more linear buffers that receive the difference signal introduce duty cycle distortion into the buffered and filtered signal.

13. The method of claim 12 wherein the signal is a differential signal.

14. The method of claim 12 further comprising filtering the output signal before providing the output signal to the error amplifier.

15. The method of claim 12 wherein the DCD target value is a digital value, and the method further comprises converting the DCD target value to an analog format prior to presenting the DCD target value to the error amplifier.

16. The method of claim 12 wherein the one or more buffers that receive the difference signal are one or more linear buffers.

17. The method of claim 12 further comprising converting the difference signal or a filtered version of the difference signal from a voltage to a current by a Gm cell before being provided to the one or more linear buffers.

18. The method of claim 12 wherein the amount of duty cycle distortion introduced into the buffered and filtered signal is controlled by the DCD target value.

19. A system for introducing duty cycle distortion in a signal comprising:
an input configured to receive a clock signal;
one or more linear buffers configured to introduce duty cycle distortion into the clock signal based on a duty cycle distortion signal to create a duty cycle distorted signal;
one or more output buffers configured to receive and transform the duty cycle distorted signal into a square wave signal with duty cycle distortion;
a feedback loop configured to receive the square wave signal with duty cycle distortion and compare it to a duty cycle distortion control signal to generate an error signal representing the difference between the square wave signal with duty cycle distortion and the duty cycle distortion control signal; and
converting the error signal to the duty cycle distortion signal and presenting the duty cycle distortion signal to a digital to analog converter which converts the duty cycle distortion control signal to an analog control signal and the analog control signal is presented to the one or more linear buffers such that the linear buffers introduce the duty cycle distortion into the clock signal to create the square wave signal with duty cycle distortion and the amount of duty cycle distortion is controlled by the duty cycle distortion control signal.

* * * * *